(12) United States Patent
Ramaraju

(10) Patent No.: US 7,286,423 B2
(45) Date of Patent: Oct. 23, 2007

(54) BIT LINE PRECHARGE IN EMBEDDED MEMORY

(75) Inventor: Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/362,694

(22) Filed: Feb. 27, 2006

(65) Prior Publication Data

US 2007/0201298 A1 Aug. 30, 2007

(51) Int. Cl.
*G11C 7/12* (2006.01)
(52) U.S. Cl. .................. 365/203; 365/49; 365/233
(58) Field of Classification Search .............. 365/195
See application file for complete search history.

(56) References Cited

U.S. PATENT DOCUMENTS

| | | | | |
|---|---|---|---|---|
| 4,627,032 | A | * | 12/1986 | Kolwicz et al. ............ 365/203 |
| 4,727,519 | A | | 2/1988 | Morton et al. |
| 5,077,693 | A | | 12/1991 | Hardee et al. |
| 5,566,108 | A | * | 10/1996 | Kitamura .................... 365/233 |
| 5,600,605 | A | * | 2/1997 | Schaefer ..................... 365/233 |
| 5,600,606 | A | * | 2/1997 | Rao ............................ 365/233 |
| 5,745,421 | A | * | 4/1998 | Pham et al. ................. 365/203 |
| 5,754,819 | A | | 5/1998 | Lynch et al. |
| 6,061,285 | A | * | 5/2000 | Tsukikawa .................. 365/201 |
| 6,205,069 | B1 | * | 3/2001 | Kim ............................ 365/203 |
| 6,813,628 | B2 | | 11/2004 | Bhushan et al. |

OTHER PUBLICATIONS

Dhong et al., "A 4.8GHz Fully Pipelined embedded SRAM in the Streaming Processor of a CELL Processor," ISSCC 2005/Session 26/Static Memory/26.7, 2005 IEEE International Solid-State Circuits Conference, pp. 486-487 and 612.

Ebergen et al., "GasP Control for Domino Circuits," IEEE, Proceedings of the Eleventh International Symposium on Advanced Research in Asynchronous Circuits and Systems, New York City, Mar. 13-16, 2005, pp. 12-22.

(Continued)

*Primary Examiner*—Tan T. Nguyen

(57) ABSTRACT

An integrated circuit device includes a first latch having a first input to receive a first predecode value, a second input to receive a first clock signal, and an output to provide a latched first predecode value responsive to an edge event of the first clock signal. The integrated circuit device further includes a memory component. The memory component includes an input to receive the latched first predecode value and the latched second predecode value, a first bit line, and a plurality of word lines coupled to the first bit line. Each word line is associated with a corresponding bit of the latched second predecode value. The integrated circuit device further includes logic having an input to receive the corresponding bit of the latched first predecode value. The logic is to precharge the first bit line directly responsive to only a value at the corresponding bit of the latched first predecode value.

20 Claims, 5 Drawing Sheets

OTHER PUBLICATIONS

Wuu et al., "The Asynchronous 24MB On-Chip Level-3 Cache for a Dual-Core Itanium-Family Processor," ISSCC 2005/Session 26/ Static Memory/ 26.8, 2005 IEEE International Solid-State Circuits Conference, pp. 488-489 and 618.

Cortadella, J., et al., "Evaluating "A+B=K"Conditions in Constant Time," IEEE ISCAS, 1998, pp. 243-246.

Cortadella, J., et al., "Evaluation of A+B=K Conditions Without Carry Propagation," IEEE Transactions on Computers, vol. 41, No. 11, Nov. 1992, pp. 1484-1488.

Heald, K., et al., "64-KByte Sum-Addressed-Memory Cache with 1.6-ns Cycle and 2.6-ns Latency," IEEE Journal of Solid-State Circuits, vol. 33, No., 11, Nov. 1998, pp. 1682-1689.

Lee, Y., et al., "Address Addition and Decoding without Carry Propagation," IEICE Trans. Inf. & Syst., vol. E80-D, No. 1, Jan. 1997, pp. 98-100.

Lynch, W., et al., "Low Load Latency through Sum-Addressed Memory (SAM)." Sun Microsystems, 11 pages, 1998.

* cited by examiner

BIT LINE PRECHARGE IN EMBEDDED MEMORY

FIELD OF THE DISCLOSURE

The present disclosure is related generally to memories and more particularly to precharging techniques for memories.

BACKGROUND

Many memory systems utilize bit line precharging to facilitate the detection of stored data by an output driver during a read access. Synchronous precharging systems typically use certain clock edges to trigger various events including memory precharging. However, as the address information typically is available before the clock edge, the reliance on the clock edge typically introduces timing bubbles that slow memory access processing. Moreover, detrimental issues related to synchronous precharging, such as skew, jitter and set-up times, can accumulate over multiple clock cycles in these conventional precharging systems, thereby impeding timely access to memory. Accordingly, an improved technique for memory precharging would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

Figure 1:
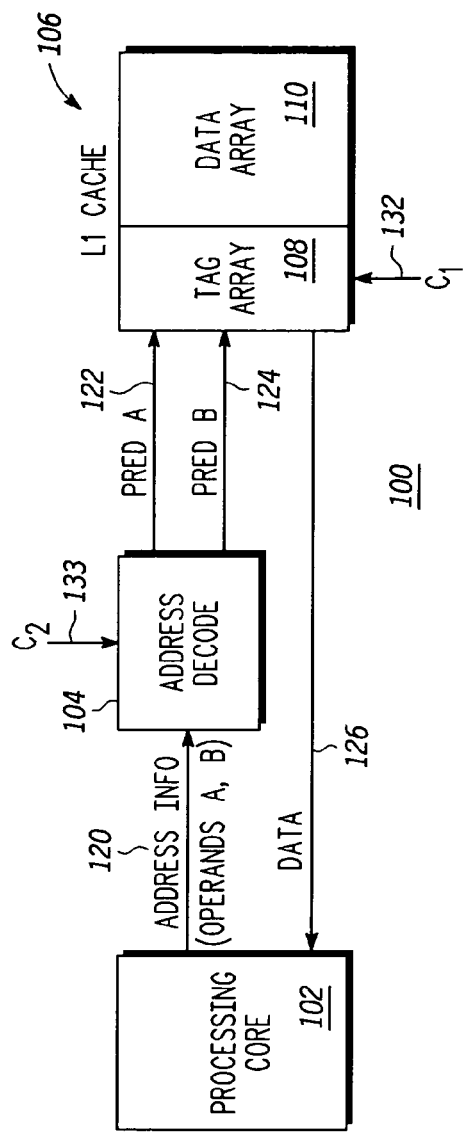
FIG. 1 is a block diagram illustrating an exemplary processing system implementing asynchronous memory precharging in accordance with at least one embodiment of the present disclosure.

In accordance with one aspect of the present disclosure, a method includes determining a first predecode value based on a first address value and latching the first predecode value responsive to a first clock signal to provide a latched first predecode value. The method further includes terminating a precharging of a first bit line of a memory component directly responsive to only the latched first predecode value.

In accordance with another aspect of the present disclosure, a method includes determining, during a first phase of a first clock signal, a first predecode value and a second predecode value based on a first address value and a second address value. The method further includes latching the first predecode value and the second predecode value responsive to a first edge event at a termination of the first phase of the first clock signal to provide a latched first predecode value and a latched second predecode value. The method additionally includes terminating a precharging of a first bit line of a first segment of a tag array of a cache directly responsive to only the latched first predecode value. The first segment is selected responsive to an assertion of a corresponding bit of the latched first predecode value. The method further includes determining a first tag value at a first word line of the first segment during a first phase of a second clock signal. The first word line is selected responsive to an assertion of a corresponding bit of the latched second predecode value. The method additionally includes latching the first tag value responsive to a second edge event at a termination of the first phase of the second clock signal.

In accordance with an additional aspect of the present disclosure, an integrated circuit device includes a first latch having a first input to receive a first predecode value, a second input to receive a first clock signal, and an output to provide a latched first predecode value responsive to an edge event of the first clock signal. The integrated circuit device further includes a memory component. The memory component includes an input to receive the latched first predecode value and the latched second predecode value, a first bit line, and a plurality of word lines coupled to the first bit line. Each word line is associated with a corresponding bit of the latched second predecode value. The integrated circuit device further includes logic having an input to receive the corresponding bit of the latched first predecode value. The logic is to precharge the first bit line directly responsive to only a value at the corresponding bit of the latched first predecode value.

FIGS. 1-6 illustrate exemplary techniques for precharging a memory component. Address information, such as a base address and an offset value, is used to generate predecode values. The predecode values are latched based on a first clock. The latched predecode values then are used to directly terminate the precharging of a specified local bit line, as well as a global bit line, of a memory component without waiting for a clock edge event (e.g., a rising clock edge), thereby reducing or eliminating timing bubbles in memory access processing due to memory precharging requirements.

Although the exemplary techniques are described herein in the context of a tag array of a data cache for use in a processing device for ease of illustration, those skilled in the art can implement the disclosed techniques in other memory components, such as embedded memory, external memory, and the like, without departing from the scope of the present disclosure.

FIG. 1 illustrates an exemplary processing system 100 utilizing bit line precharging in accordance with one embodiment of the present disclosure. The processing system 100 represents any of a variety of processing systems that utilize memory to store information. Exemplary implementations of the system 100 include an integrated circuit device, such as a microprocessor or microcontroller, a multiple-chip design, such as a personal computer motherboard, and the like. For ease of illustration, the processing system 100 is discussed herein in the context of an integrated circuit device having an embedded data cache.

As illustrated, the processing system 100 includes a processing core 102, an address decode module 104, and a level 1 (L1) data cache 106 connected via one or more busses. The L1 data cache 106 includes a tag array 108 and a data array 110. In operation, the processing core 102 accesses the L1 data cache 106 to obtain stored data for use while executing instructions. As part of the access process, the processing core 102 provides address information 120 associated with the cache access to the address decode module 104 for predecoding. The address information 120 includes two or more operands, such as operands A and B. The operands A and B, in one embodiment, include a base address and an offset value that are used by a memory management unit (MMU) (not shown) to calculate an effective address used to access the L1 data cache 106.

In response to receiving the operands A and B of the address information 120, the address decode module 104 generates two or more predecode values, including pred A and pred B. An exemplary method for generating values for pred A and pred B from operands A and B is described in U.S. patent application Ser. No. 11/257,932, entitled "SYSTEM AND METHOD FOR MEMORY ARRAY WITH FAST ADDRESS DECODER" and filed on Oct. 25, 2005, the entirety of which is incorporated by reference herein.

The address decode module 104 provides the pred A and pred B values to the tag array 108 as signal 122 and signal 124, respectively. The tag array 108 completes the predecoding of the address information 120 by activating a word line based on the pred A and pred B values. A method for generating the effective address based on the pred A and pred B values is described in U.S. patent application Ser. No. 11/257,932, cited above. The tag array 108 then compares the tag data stored at the tag memory location associated with the effective address to determine whether the requested data is stored in the data array 110. If so, the requested data is provided from the L1 data cache 106 to the processing core 102 as signal 126.

It will be appreciated that the tag array 108 and the data array 110 perform high speed sensing and therefore utilize memory precharging during read accesses for proper bit value detection at the output drivers (not shown) of the tag array 108 and the data array 110. However, as opposed to conventional techniques in which a clock edge or clock phase change serves as the trigger for terminating the precharging once the corresponding bit line is identified, the processing system 100, in one embodiment, utilizes the pred A or pred B values to asynchronously terminate precharging (i.e., without waiting for a clock edge event as a trigger) of the corresponding bit line identified by the pred A and pred B values. As illustrated, the tag array 108 receives a clock signal 132 (clock $C_1$) and the address decode module 104 receives a clock signal 133 (clock $C_2$), where the clock signal 133, in one embodiment, is a substantially inverted representation of clock signal 132. As described in greater detail herein with reference to FIG. 2, the address decode module 104 utilizes the clock signal 133 to control the predecoding of the operands A and B to generate the pred A and B values and further to control the latching of the pred A and B values. Once latched, the pred values A and B precharging of a corresponding bit line at the tag array 108 is terminated directly responsive to at least one of the pred A value or the pred B value. The tag array 108 then uses the clock signal 132 to control the latching of the tag value identified by the effective address calculated from the pred A and pred B values. Thus, rather than relying on the clock signal 132 to trigger the termination of the precharge of the tag array 108, the tag array 108 can utilize the pred A and B values to identify the appropriate bit lines and terminate the precharging process as soon as the pred A and B values are latched. By reducing the reliance on the clock signal 132, the tag array 108 can more quickly access the appropriate bit lines and therefore make the corresponding tag data available sooner than compared to conventional synchronous precharging techniques.

Figure 2:
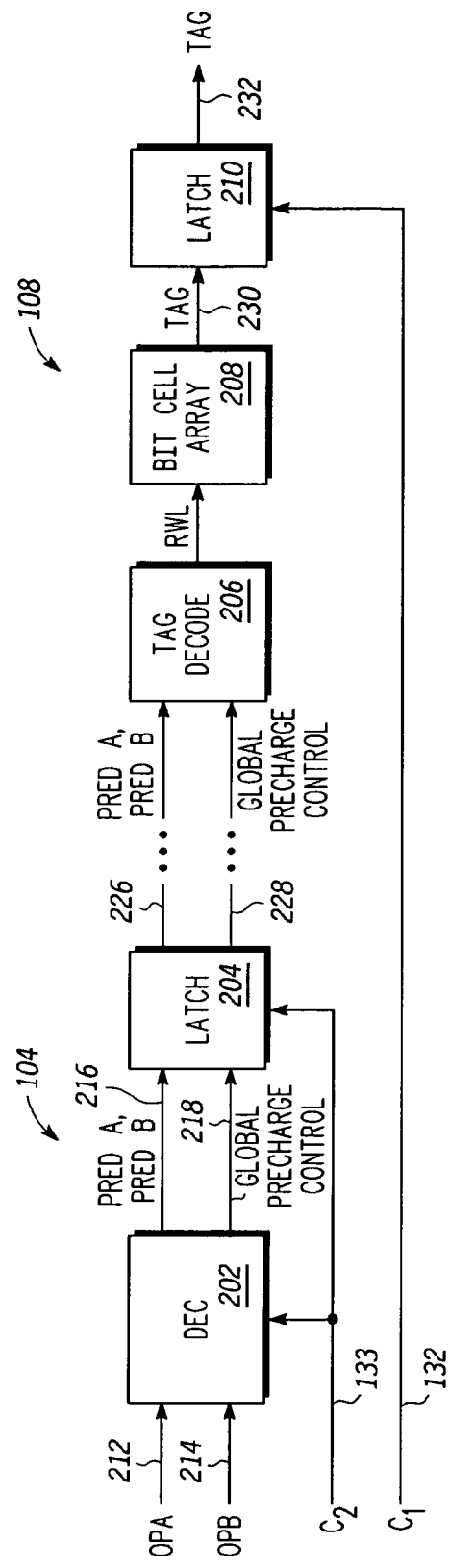
FIG. 2 is a block diagram illustrating an exemplary asynchronous memory precharging system in accordance with at least one embodiment of the present disclosure.

Referring to FIG. 2, the asynchronous precharging system utilized by the processing system 100 is illustrated in greater detail in accordance with at least one embodiment of the present disclosure. In the depicted example, the address decode module 104 includes a decode module 202 and a latch 204 and the tag array 108 includes a tag decode module 206, a bit cell array 208 and a latch 210. The decode module 202 has inputs to receive operands A (signal 212) and B (signal 214), respectively, and an input to receive clock signal 133 (clock $C_2$). The decode module 202 further has an output to provide the pred A and B values (signal 216) generated by the decode module 202 from the operand A and B values and an output to provide a global precharge control signal 218. The global precharge control signal 218 serves to control the precharging of a global bit line of the tag array 108 as described herein. The latch 204 includes a latch input to receive the operand A and B values, a latch input to receive the global precharge control signal 218, a control input to receive the clock signal 133, and outputs to provide latched pred A and B values (signal 226) and a latched global precharge control signal 228 responsive to the clock signal 133. The latch 204 may include a dynamic latch, a static latch, a cheater latch, and the like.

The tag decode module 206 includes an input to receive the pred A and pred B values (signal 226), an input to receive the latched global precharge control signal 228, and an output to provide a read word line (RWL) identifier corresponding to an address value determined from the pred A and pred B values. The bit cell array 208 includes an input to receive the RWL identifier, a plurality of rows of bit cells corresponding to a plurality of read word lines, and an output to provide a tag value (signal 230) stored at the row of bit cells corresponding the RWL identifier received at the input. The latch 210 includes a latch input to receive the tag value, a control input to receive the clock signal 132, and an output to provide a latched tag value (signal 232) responsive to the clock signal 132.

As FIG. 2 illustrates, the operation of the decode module 202 to generate the pred A and B values is controlled by the clock signal 133, as is the latching of the pred A and B values by the latch 204. However, as also illustrated, the precharging of the latched bit cell array 208 is directly responsive to only the latched pred A and B values and the global precharge control signal 228 without relying on a clock signal to serve as the precharge trigger.

Figure 3:
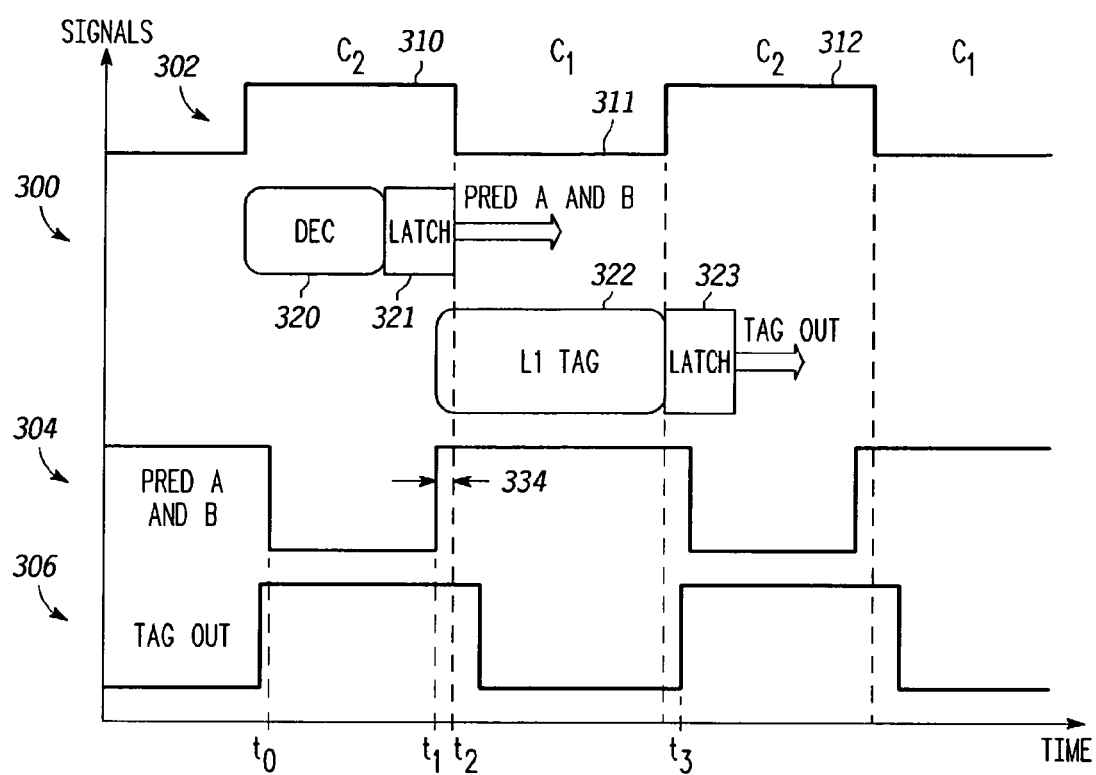
FIG. 3 is a timing diagram illustrating an exemplary local bit line and global bit line precharging scheme in accordance with at least one embodiment of the present disclosure.

Referring to FIG. 3, a timing diagram 300 illustrating an exemplary operation of the precharging system of FIG. 2 is illustrated in accordance with at least one embodiment of the present disclosure. The timing diagram 300 includes clock signal 302 representing clock signal 132 and clock signal 133, a predecode signal 304 representing the generation of pred A and B values for a series of cache accesses, and a tag out signal 306 representing the determination of the tag value in response to the pred A and pred B values.

As illustrated during clock phase 310 where the clock signal 133 is high and the clock signal 132 is low precharging of the bit lines begins at time $t_0$ and the decode module 202 (FIG. 2) generates the pred A and pred B values at duration 320. The latch 204 (FIG. 2) latches the pred A and pred B values at duration 321 of clock phase 310. The latched pred A and B values become available to the tag decode module 206 (FIG. 2) at time $t_1$ of duration 321 prior to the edge event at the end of clock phase 310. In response to the output of the pred A and pred B values by the latch 204, the bit cell array 208 (FIG. 2) ends the precharging of one or more bit lines identified by at least one of the pred A and B values at duration 322. At duration 322, the tag decode module 206 continues to determine the effective address identifying the corresponding storage location of the bit cell array 208 and, once identified, the tag value stored in the identified storage location is output to the latch 210 (FIG. 2). At time $t_3$ of duration 323, the latch 210 latches the tag value in response to the edge event between clock phases 311 and 312 and provides the latched tag value for output, where the latched tag value is used to determine whether the corresponding storage location of the data array 110 (FIG. 1) stores the requested data. Thus, rather than having to wait for the edge event at time $t_2$ as in conventional precharging schemes, the tag decode module 206 can cease precharging as soon as the latched values are available at time $t_1$, thereby reducing or eliminating the time lag 334 between when the latched pred A and B values become available (time $t_1$) and when the edge event occurs (time $t_2$).

Figure 4:
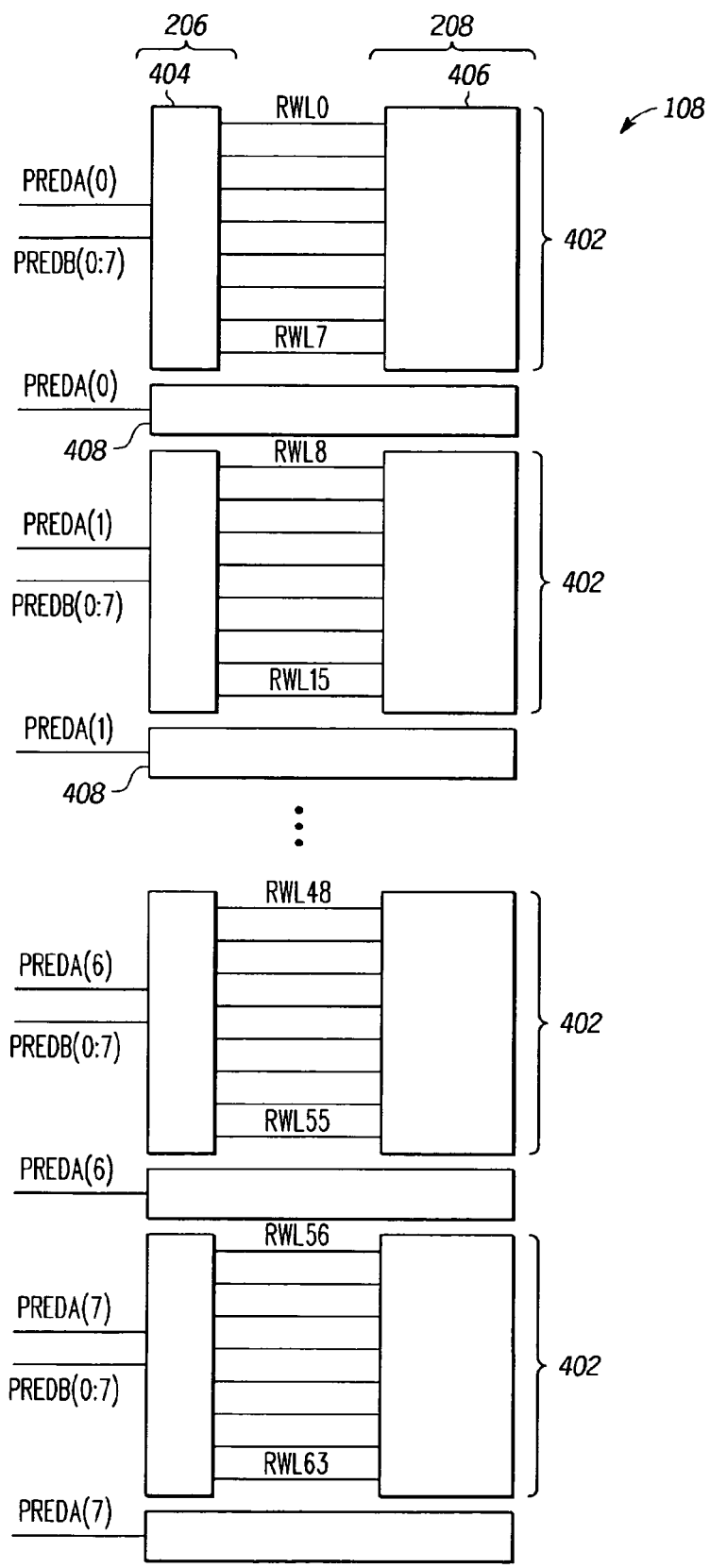
FIG. 4 is a diagram illustrating an exemplary memory component in accordance with at least one embodiment of the present disclosure.
Figure 5:
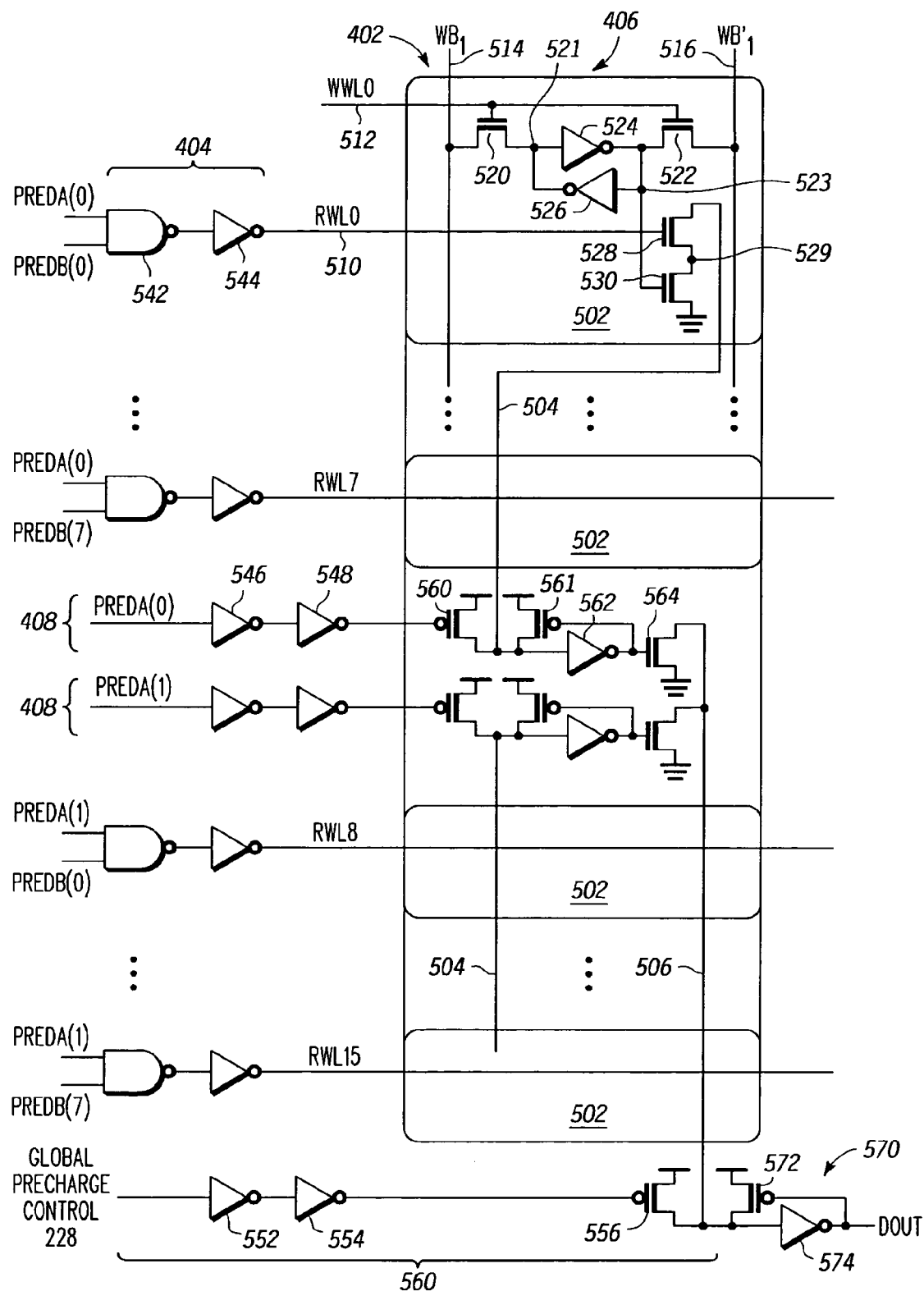
FIG. 5 is a diagram illustrating an exemplary implementation of the memory component of FIG. 4 in accordance with at least one embodiment of the present disclosure.

Referring to FIGS. 4 and 5, an exemplary implementation of the tag array 108 is illustrated in accordance with at least one embodiment of the present disclosure. As depicted by FIG. 4, the tag array 108 may be partitioned into a plurality of memory blocks 402, where each memory block 402 includes a tag decode module 404 and a bit cell module 406. Each tag decode module 404 receives a corresponding predecode bit pred A[x] and n bit values from pred B[0:n–1] from which a corresponding plurality of read word lines (RWLs) are controlled. To illustrate in the context of FIG. 4, the pred A and B values are eight-bit values (pred A[0:7] and pred B[0:7]), where the first memory block 402 receives pred A[0] and pred B[0:7] to control RWLs 0-7, the second memory block 402 receives pred A[1] and pred B[0:7] to control RWLs 8-15, and so on. The tag array 108 further comprises a plurality of precharge modules 408, where each precharge module 408 receives a corresponding bit value from the pred A value. To illustrate, the first precharge module 408 receives pred A[0], the second precharge module 410 receives pred A[1], and so on.

In the depicted example, each of the pred A and B values are one hot values so that only one bit position of each value is asserted. As each of the memory blocks 402 receives a different bit of the pred A value, the asserted bit of the pred A value identifies the corresponding memory block 402 that is to be accessed for a read operation. In a similar manner, the multiple bit values of the one hot pred B value are utilized to determine which read word line of the identified memory block 402 is to be asserted. To illustrate, assume that the pred A[0:7] has a value of x01000000 (i.e., pred A[1] is asserted), where the second memory block 402 receives pred A[1] at its input. Further assume that pred B[0:7] has a value of x00000100 (i.e., pred B[5] is asserted). In this example, because the tag decode module 404 of the second memory block 402 is triggered due to pred A[1] being asserted, the tag decode module 404 is activated and, in response, asserts RWL 5, which corresponds to the asserted pred B[5] bit position.

In addition to identifying the memory block and read word line associated with the read operation, the pred A value also serves to directly trigger the termination of the precharging of the appropriate bit line. As the pred A value is a one hot value, only one of the precharge modules 408 receives an asserted value. Accordingly, each of the precharge modules 408 is configured to cease precharging of the local bit line of the corresponding memory block in response to an assertion of its corresponding bit value of the pred A value. To illustrate, assume that the pred A[0:7] has a value of x10000000 (i.e., the pred A[0] bit value is asserted), where the first memory block 402 and the first precharge module 408 receives pred A[0] at its input. In this example, the first precharge module 408 would cease precharging of the local bit line of the first memory block 402 in response to receiving the asserted pred A[0] bit value.

FIG. 5 illustrates the implementation of FIG. 4 in greater detail. In the depicted example, each bit cell module 406 of the memory block 402 includes a plurality of rows of bit cells 502. Each row of bit cells 502 is connected to a corresponding read word line (e.g., RWL0) of the memory block 402. Further, each column of bit cells 502 of the bit cell module 402 is connected to a corresponding local bit line 504. Each local bit line 504 in turn is connected to a corresponding global bit line 506. Each global bit line 506 is connected to an output driver 570 that determines a stored bit value based on a voltage or current carried on the global bit line 506. In the illustrated example, the output driver 570 includes: a transistor 572 having a first current carrying electrode coupled to the global bit line 506, a second current carrying electrode coupled to a voltage reference (e.g., Vcc), and a control electrode coupled to the output (DOUT) of the output driver 570; and an inverter 574 having an input coupled to the global bit line 506 and an output coupled to the output (dout) of the output driver 570.

In the illustrated example, each bit cell 502 comprises an eight transistor (8T) bit cell connected to a write word line (WWL) 512, a read word line (RWL) 510, write bit lines 514 ($Wb_1$) and 516 ($Wb_1'$), and the corresponding local bit line 504. Thus, the bit cell 502 includes: a transistor 520 having a control electrode coupled to the write word line 512, a first current carrying electrode coupled to the write bit line 514, and a second current carrying electrode coupled to node 521; a transistor 522 having a control electrode coupled to the write word line 512, a first current carrying electrode coupled to the write bit line 516, and a second current carrying electrode coupled to a node 523; an inverter 524 having an input coupled to the node 521 and an output coupled to the node 523; an inverter 526 having an input coupled to the node 523 and an output coupled to the node 521; a transistor 528 having a control electrode coupled to the read word line 510, a first current carrying electrode coupled to node 529 and a second current carrying electrode coupled to the local bit line 504; and a transistor 530 having a control electrode coupled to node 523, a first current carrying electrode coupled to node 529 and a second current carrying electrode coupled to a voltage reference (e.g., ground).

As FIG. 5 illustrates, the tag decode module 404 can be implemented as combinatorial logic, where each bit pair (pred A[x], pred B[n]) is input to a corresponding NAND gate 542 and the output of the NAND gate is input to an inverter, which in turn is used to assert and deassert a corresponding read word line. To illustrate, the first memory block 404 receives the values pred A[0] and pred [0:7], where pred A[0] and pred[0] are input to the NAND gate 542 and the output of the NAND gate 542 is provided to the inverter 544, which in turn controls the read word line 510 (RWL0). Thus, when bit values pred A[0] and pred B[0] are asserted for the one hot pred A and B values, the output of the inverter 544 will be asserted, thereby asserting the read word line 510. Likewise, when either of the bit values pred A[0] and pred B[0] are not asserted, the output of the inverter 544 will be not be asserted, so the read word line 510 will not be asserted. Further, in certain instances, a read enable signal may be utilized to control read accesses. Accordingly, the NAND gate 542 further may include a third input to receive the read enable signal so that the output of the NAND gate is negated only when the read enable signal is asserted.

As FIG. 5 further illustrates, the precharge modules 408 also can be implemented as combinatorial logic. In the depicted example, each precharge module 408 includes: an inverter 546 having an input to receive a corresponding bit value of the pred A value and an output; an inverter 548 having an input coupled to the output of the inverter 546 and an output; a p-type transistor 560 having a control electrode coupled to the output of the inverter 548, a first current carrying electrode coupled to a voltage reference (e.g., Vcc) and a second current carrying electrode coupled to the local bit line 504; an inverter 562 having an input coupled to the local bit line 504 and an output; a keeper transistor 561 having a first current carrying electrode coupled to a voltage reference (e.g., Vcc), a second current carrying electrode coupled to the input of the inverter 562 and a control electrode coupled to the output of the inverter 562; and a transistor 564 having a control electrode coupled to the output of the inverter 562, a first current carrying electrode coupled to a voltage reference (e.g., ground), and a second current carrying electrode coupled to the global bit line 506. Thus, the transistor 560 ceases current flow between its current carrying electrodes in direct response to only the assertion of the corresponding bit value of the pred A value, thereby allowing the local bit lines 504 to carry the value stored in the bit cell 502. It will be appreciated that the precharge module 408 includes the same configuration for the other local bit lines of the memory block 502.

In addition to asynchronously terminating precharging the local bit lines of the memory block 402 to be accessed, a global precharge module 560 is used to asynchronously terminate precharging of the global bit lines 506 of the tag array 108 in response to an assertion of the global precharge control signal 218 (FIG. 2). In one embodiment, the precharge control signal 218 is asserted whenever any of the pred A bit positions are asserted (i.e., whenever the pred A value is not zero). Thus, the global precharge control signal 218 can be generated as, for example, the output of an OR gate (or a hierarchy of OR gates) having an input for each of the bit positions of the pred A value. In the depicted example, the global precharge module 560 is implemented as combinatorial logic, including: an inverter 552 having an input to receive the global precharge control signal 218 and an output; an inverter 554 having an input coupled to the output of the inverter 552 and an output; and a p-type transistor 556 having a control electrode coupled to the output of the inverter 554, a first current carrying electrode coupled to a voltage reference (e.g., Vcc), and a second current carrying electrode coupled to the global bit line 506. It will be appreciated that the inverters 552 and 554 serve to match the delay introduced by the NAND gate 542 and the inverter 544 for use in asserting the corresponding read word line. Thus, when the global precharge control signal 218 is asserted, the transistor 556 denying the flow of current between its current carrying electrodes, thereby allowing the global bit line 506 to carry the value on the local bit line 504.

Figure 6:
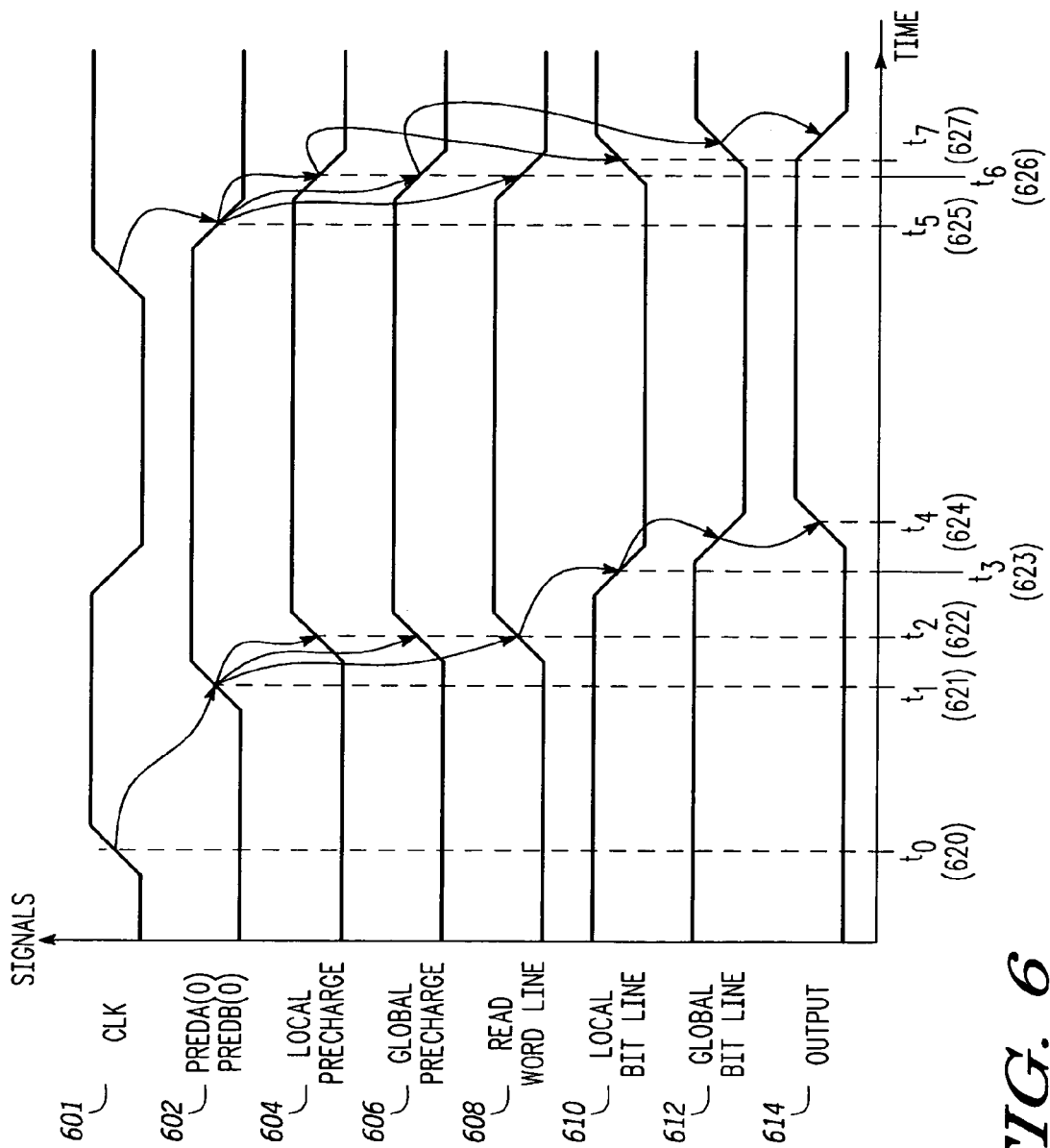
FIG. 6 is a timing diagram illustrating an exemplary operation of the memory component implementation of FIG. 5 in accordance with at least one embodiment of the present disclosure.

Referring to FIG. 6, a timing diagram 600 illustrating an exemplary operation of the implementation of FIGS. 4 and 5 is illustrated in accordance with at least one embodiment of the present disclosure. The timing diagram 600 includes a signal 601 representative of the clock signals 132 and 133 (FIG. 1), signal 602 representative of the assertion of the pred A and pred B values, a signal 604 (active low) representative of the precharging of local bit lines of a memory block, a signal 606 (active low) representative of the precharging of global bit lines of the memory block, a signal 608 representative of the assertion of a read word line of the memory block, a signal 610 representative of the output of the values of a row of bit cells onto the corresponding local bit lines, a signal 612 representative of the transfer of the values from the local bit lines to the global bit lines, and a signal 614 representative of the output of a tag value resulting from sense amplification of the global bit lines.

At time t0 (time 620), an edge event (e.g., a rising edge) of the clock signal (signal 601) enables the generation of the pred A and pred B values. Prior to time $t_1$, the local and global bit lines are precharged. At time $t_1$ (time 621), the pred A and B values are latched and, in response, the precharging of the local bit lines and the global bit lines of the memory block identified by the pred A value is asynchronously terminated at time $t_2$ (time 622) the corresponding read word line identified by the pred A value is asserted. At time $t_3$ (time 623), the values of each of the bit cells along the row corresponding to the asserted read word line are transferred to a corresponding precharged bit line and at time $t_4$ (time 624), the values on the local bit lines are transferred to the corresponding global bit lines and provided as an output.

At time $t_5$ (time 625), the pred A and B values are pulled low or unasserted and, in response, the precharging process for the local and global bit lines begins at time $t_6$ (time 626). Thereafter, the local bit lines and global bit lines are precharged at time $t_7$ (time 627) and, consequently, the output of the tag array 108 is deasserted or pulled low.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method comprising:
   determining a first predecode value based on a first address value;
   latching the first predecode value responsive to a first clock signal to provide a latched first predecode value; and
   terminating a precharging of a first bit line of a memory component directly responsive to only the latched first predecode value.

2. The method of claim 1, wherein the memory component comprises a tag array of a cache.

3. The method of claim 2, further comprising:
   determining a tag value associated with the tag array based on the latched first predecode value; and
   latching the tag value responsive to a second clock signal.

4. The method of claim 3, wherein the second clock signal comprises a substantially inverted representation of the first clock signal.

5. The method of claim 1, further comprising:
   determining a second predecode value based on a second address value;
   latching the second predecode value responsive to the first clock signal to provide a latched second predecode value; and
   terminating a precharging of a second bit line of the memory component directly responsive to only the latched second predecode value, wherein the second bit line of the memory component is associated with the second predecode value.

6. The method of claim 5, wherein:
   the first bit line includes a first local bit line associated with a first memory segment of the memory component, the first memory segment comprising a first plurality of word lines; and the second bit line includes a second local bit line associated with a second memory segment of the memory component, the second memory segment comprising a second plurality of word lines.

7. The method of claim 6, further comprising:
terminating a precharging of a global bit line associated with the first bit line and the second bit line directly responsive to only at least one of the first predecode value and the second predecode value.

8. The method of claim 1, wherein:
the memory component comprises a plurality of memory segments, each memory segment comprising a corresponding plurality of word lines;
each bit of the first predecode value is associated with a corresponding one of the plurality of memory segments; and
wherein a precharging of a bit line of a memory segment is terminated directly responsive to an assertion of the corresponding bit of the first predecode value.

9. A method comprising:
determining, during a first phase of a first clock signal, a first predecode value and a second predecode value based on a first address value and a second address value;
latching the first predecode value and the second predecode value responsive to a first edge event at a termination of the first phase of the first clock signal to provide a latched first predecode value and a latched second predecode value;
terminating a precharging of a first bit line of a first segment of a tag array of a cache directly responsive to only the latched first predecode value, wherein the first segment is selected responsive to an assertion of a corresponding bit of the latched first predecode value;
determining a first tag value at a first word line of the first segment during a first phase of a second clock signal, wherein the first word line is selected responsive to an assertion of a corresponding bit of the latched second predecode value; and
latching the first tag value responsive to a second edge event at a termination of the first phase of the second clock signal.

10. The method of claim 9, wherein the tag array comprises a global bit line and a plurality of segments including the first segment, each segment comprising a corresponding plurality of word lines and a local bit line coupled to the global bit line, wherein the first bit line of the first segment comprises a local bit line of the first segment.

11. The method of claim 10, further comprising:
terminating a precharging of the global bit line directly responsive to only the latched first predecode value.

12. The method of claim 9, further comprising:
determining, during a second phase of the first clock signal subsequent to the first phase, a third predecode value and a fourth predecode value based on a third address value and a fourth address value;
latching the third predecode value and the fourth predecode value responsive to a third edge event at a termination of the second phase of the first clock signal to provide a latched third predecode value and a latched fourth predecode value;
terminating a precharging of a second bit line of a second segment of the tag array directly responsive to only the latched third predecode value, wherein the second segment is selected responsive to an assertion of a corresponding bit of the latched third predecode value;
determining a second tag value at a second word line of the second segment during a second phase of the second clock signal, wherein the second word line is selected responsive to an assertion of a corresponding bit of the latched fourth predecode value; and
latching the second tag value responsive to a fourth edge event at a termination of the second phase of the second clock signal.

13. An integrated circuit device comprising:
a first latch having a first input to receive a first predecode value and a second predecode value, a second input to receive a first clock signal, and an output to provide a latched first predecode value and a latched second predecode value responsive to an edge event of the first clock signal;
a memory component comprising:
an input to receive the latched first predecode value and the latched second predecode value;
a first bit line;
a plurality of word lines coupled to the first bit line, wherein each word line is associated with a corresponding bit of the latched second predecode value; and
logic having an input to receive the corresponding bit of the latched first predecode value, the logic to precharge the first bit line directly responsive to only a value at the corresponding bit of the latched first predecode value.

14. The integrated circuit device of claim 13, further comprising:
a predecode module comprising a first input to receive a first address value, a second input to receive a second address value and an output coupled to the first input of the latch to provide the first predecode value based on the first address value and the second address value.

15. The integrated circuit device of claim 13, further comprising:
a second latch having a first input coupled to an output of the memory component, a second input to receive a second clock signal, and an output to provide a latched output value responsive to an edge event of the second clock signal.

16. The integrated circuit device of claim 15, wherein the memory component comprises a tag array of a cache and the latched output value comprises a latched tag value.

17. The integrated circuit device of claim 13, wherein the first latch comprises a latch selected from a group consisting of: a dynamic latch, a static latch and a cheater latch.

18. The integrated circuit device of claim 13, wherein the memory component further comprises:
logic having an input to receive the latched second predecode value, the logic to assert an identified word line of the plurality of word lines responsive to an assertion of the value at a bit of the latched second predecode value corresponding the identified word line.

19. The integrated circuit device of claim 13, wherein the memory component further comprises:
a second bit line; and
logic having an input to receive the latched first predecode value, the logic to precharge the second bit line directly responsive to the latched first predecode value.

20. The integrated circuit device of claim 13, wherein the second clock signal comprises a substantially inverted representation of the first clock signal.

* * * * *